United States Patent
Saint-Ramond et al.

(10) Patent No.: US 7,569,251 B2
(45) Date of Patent: Aug. 4, 2009

(54) METHOD OF FORMING A THERMAL PROTECTIVE COATING ON A SUPER ALLOY METAL SUBSTRATE

(75) Inventors: Bertrand Saint-Ramond, Fontainebleau (FR); Manuel Silva, Gouvix (FR); John Nicholls, Milton Keynes (GB); Maxime Carlin, Flitwick (GB)

(73) Assignee: Snecma, Paris (FR)

( * ) Notice: Subject to any disclaimer, the term of this patent is extended or adjusted under 35 U.S.C. 154(b) by 190 days.

(21) Appl. No.: 11/546,316

(22) Filed: Oct. 12, 2006

(65) Prior Publication Data

US 2009/0087572 A1 Apr. 2, 2009

Related U.S. Application Data

(62) Division of application No. 10/974,973, filed on Oct. 28, 2004, now Pat. No. 7,311,981.

(30) Foreign Application Priority Data

Oct. 28, 2003 (FR) .................................. 03/12619

(51) Int. Cl.
*C23C 16/40* (2006.01)
*C23C 16/14* (2006.01)
(52) U.S. Cl. .............................. 427/255.32; 427/255.34; 427/255.7; 427/376.6; 427/596
(58) Field of Classification Search ................. 427/250, 427/255.31, 255.32, 255.7, 376.6, 255.34, 427/596; 204/192.1, 192.16
See application file for complete search history.

(56) References Cited

U.S. PATENT DOCUMENTS

| | | | |
|---|---|---|---|
| 5,238,752 A | 8/1993 | Duderstadt et al. | |
| 5,716,720 A * | 2/1998 | Murphy | 428/623 |
| 5,856,027 A | 1/1999 | Murphy | |
| 6,395,406 B1 | 5/2002 | Sangeeta | |
| 6,482,469 B1 | 11/2002 | Spitsberg et al. | |
| 6,589,668 B1 | 7/2003 | Braithwaite et al. | |
| 6,645,351 B2 * | 11/2003 | Saint Ramond et al. | 204/192.15 |
| 6,669,989 B2 * | 12/2003 | Movchan et al. | 427/249.5 |
| 6,682,827 B2 * | 1/2004 | Darolia et al. | 428/632 |
| 6,863,738 B2 * | 3/2005 | Kool et al. | 134/3 |
| 7,311,981 B2 | 12/2007 | Saint Ramond et al. | |
| 2002/0009611 A1 | 1/2002 | Darolia et al. | |

(Continued)

OTHER PUBLICATIONS

Hayashi, S., et al., "a-NiPt(Al) and phase equilibria in the Ni-Al-Pt system at 1150 oC". Acta Materialia 53 (2005) pp. 3319-3328.*

(Continued)

*Primary Examiner*—Bret Chen
(74) *Attorney, Agent, or Firm*—Rothwell, Figg, Ernst & Manbeck, PC

(57) ABSTRACT

A method of forming a gas turbine part includes forming a bonding underlayer on a superalloy metal substrate, the underlayer including an intermetallic compound of aluminum, nickel, and platinum, and forming a ceramic outer layer on the alumina film formed on the bonding underlayer. The bonding underlayer essentially comprises an Ni—Pt—Al ternary system constituted by an aluminum-enriched α-NiPt type structure, in particular an Ni—Pt—Al ternary system having a composition $Ni_zPt_yAl_x$ in which $z$, $y$, and $x$ are such that $0.05 \leq z \leq 0.40$, $0.30 \leq y \leq 0.06$, and $0.15 \leq x \leq 0.40$.

11 Claims, 6 Drawing Sheets

U.S. PATENT DOCUMENTS

| | | |
|---|---|---|
| 2002/0037220 A1 | 3/2002 | Saint Ramond et al. |
| 2004/0028938 A1* | 2/2004 | Saint Ramond et al. ..... 428/632 |
| 2004/0229075 A1 | 11/2004 | Gleeson et al. |
| 2007/0048538 A1* | 3/2007 | Schaeffer ................... 428/471 |
| 2007/0082221 A1* | 4/2007 | Schaeffer ................... 428/670 |

OTHER PUBLICATIONS

Copland, Evan, "Thermodynamic Effect of Platinum Addition to b-NiAl: An Initial Investigation". NASA/CR-2005-213330. 2005. no page numbers.*

Movchan, B.A., et al., "Graded thermal barrier coatings, deposited by EB-PVD". Surface & Coatings Technology 188-189 (2004) pp. 85-92.*

Hovis, D.B., et al., "Confocal photo-stimulated microspectroscopy (CPSM)—residual stress measurements in $Al_2O_3$ using confocal microscopy". Scripta Materialia 53 (2005) pp. 347-349.*

* cited by examiner

○ = Ni or Al

● = Pt

METHOD OF FORMING A THERMAL PROTECTIVE COATING ON A SUPER ALLOY METAL SUBSTRATE

CROSS REFERENCE OF RELATED APPLICATION

This application is a Divisional of patent application Ser. No. 10/974,973, filed Oct. 28, 2004, now U.S. Pat. No. 7,311,981, which is incorporated herein by reference.

BACKGROUND OF INVENTION

The invention relates to making a protective coating on a superalloy metal substrate.

The field of application of the invention is making parts that are capable of retaining mechanical strength at high temperatures, in particular gas turbine parts, such as turbine blades, in particular for turbojets.

In order to improve performance, and in particular efficiency, it is desirable to cause gas turbines to operate at temperatures that are as high as possible.

In order to make parts for the hot portions, it is common practice to use superalloys. These alloys usually comprise nickel as the main constituent and additional elements generally selected from chromium, cobalt, aluminum, molybdenum, titanium, tantalum, and many others.

An increase in operating temperature is made possible by providing the metal substrate of such parts with a protective coating forming a thermal barrier.

It is known to make a protective coating comprising an ceramic outer layer and a bonding underlayer of metal, in particular a bonding underlayer containing aluminum and at least one other metal, such as platinum.

The bonding underlayer interposed between the superalloy metal substrate and the ceramic outer layer performs the following functions:

- it enables a film of alumina to form and to persist at its surface, thereby enhancing bonding with the ceramic outer layer;
- it protects the substrate from corrosion by oxidation by the oxygen in the ambient medium that manages to pass through the outer ceramic layer; and
- it constitutes a diffusion barrier against certain elements of the metal substrate which would otherwise contaminate the film of alumina, and would consequently affect the interface between the bonding underlayer and the outer ceramic layer, thereby affecting the adhesion thereof.

Including reactive elements such as yttrium, cerium, hafnium, or lanthanides in the bonding underlayer reinforces its diffusion barrier function and enhances the persistence of the "adhesive" film of alumina.

It is well known to form a bonding underlayer of the MCrAlY type (where M is a metal such as Fe, Ni, Co) by a method such as plasma projection, without inducing a reaction with the substrate, the adhesion of the bonding underlayer on the substrate being of a mechanical kind. Reference can be made, for example, to U.S. Pat. Nos. 4,055,704 and 5,824,423. Nevertheless, in order to obtain an under-layer that is thermally stable, it is necessary to give it relatively large thickness, typically at least a thickness lying in the range 50 micrometers ($\mu$m) to 100 $\mu$m, and such thickness is penalizing in terms of weight.

Other known methods consist in making a bonding underlayer out of an intermetallic compound, which can be of smaller thickness because of its thermal stability. An intermetallic compound comprising aluminum and platinum has been found to have good properties.

Thus, U.S. Pat. Nos. 5,716,720 and 5,856,027 describe a method consisting in electroplating a layer of platinum on a substrate made of a nickel-based superalloy, and subsequently in performing vapor aluminization at a temperature greater than 1000° C. Nickel coming from the substrate diffuses into the bonding underlayer. An alumina film is formed by heat treatment at the surface of the bonding underlayer prior to forming a ceramic outer layer, e.g. of yttria stabilised zirconia obtained by physical vapor deposition (PVD).

A reactive element may be introduced into the bonding underlayer during the vapor aluminization step. In its outer portion surmounting a diffusion zone in the vicinity of the substrate, the bonding underlayer presents an intermediate phase comprising 18% to 28% by weight aluminum, 50% to 60% by weight nickel, and 8% to 35% by weight platinum, corresponding to a $\beta$-type solid solution phase in the binary nickel-aluminum phase diagram ($\beta$-NiAl).

U.S. Pat. No. 5,238,752 describes another method consisting in forming on a superalloy substrate a bonding underlayer made of an intermetallic compound, in particular a compound of aluminum and platinum. The bonding under-layer is made by pack cementation at a temperature higher than 985° C. and at a thickness greater than 25 $\mu$m. An alumina film is formed by oxidation at the surface of the bonding underlayer prior to forming a ceramic outer layer, e.g. of yttria stabilised zirconia by physical vapor deposition.

European patent application EP 0 985 744 describes yet another method comprising forming a layer of platinum on a nickel-based superalloy substrate by electroplating or by chemical vapor deposition, and depositing a layer of aluminum which is made from a gaseous halide and which diffuses into the layer of platinum. Sulfur is removed after each deposit by heat treatment at a temperature higher than 1050° C. with surface descaling so as to eliminate sulfur which is harmful to adhesion of the alumina film developed on the surface of the resulting bonding underlayer.

US patent application No. US 2002/0037220 discloses a method in which the bonding underlayer is formed by physical vapor deposition of a plurality of individual layers alternately of aluminum and of a metal from the platinum group, and by exothermal reaction between the metals of the layers formed. By using a physical vapor deposition method, the temperature of the substrate is relatively low, and remains at a value well below that from which the elements of the substrate are liable to diffuse into the deposit being formed.

OBJECT AND SUMMARY OF THE INVENTION

An object of the invention is to provide a gas turbine part comprising a superalloy metal substrate provided with a protective coating having a bonding under-layer between the substrate and the ceramic outer layer that is stable and that presents long-term resistance to spalling of the ceramic layer, while being small in thickness and therefore light in weight.

This object is achieved by a gas turbine part comprising a superalloy metal substrate, a bonding underlayer formed on the substrate and comprising an intermetallic compound comprising aluminum, nickel, and platinum, and a ceramic outer coating anchored on a film of alumina formed on the bonding underlayer, in which, in accordance with the invention, the bonding underlayer essentially comprises an Ni—Pt—Al ternary system constituted by an aluminum-enriched $\alpha$-NiPt type structure.

A characteristic of the invention lies in at least a majority of the bonding underlayer being constituted by a solid solution phase of a type in the nickel (Ni) and platinum (Pt) binary phase diagram and also incorporating aluminum (Al).

It is because of the great stability of such a phase that a bonding under-layer can be made, even with small thickness, without affecting the properties, and in particular the robustness, of the thermal protection. The thermal protection presents increased resistance to spalling, even after repeated thermal cycles.

In addition, with a substrate made of a nickel-based superalloy, the diffusion of nickel over time from the substrate into the bonding layer can modify the composition of the bonding layer, but not its structure, and thus cannot modify the stability of the α-NiPt intermetallic compound, with this being more marked the closer the initial nickel content is to its minimum value in the α-NiPt domain.

An α-type NiPt solid solution phase that is enriched in Al is itself known and can be characterized by its crystallographic structure as described in particular in an article by Janice L. Kann et al. entitled "Phase stability in (Ni,Pt)$_3$Al alloys" and published in Scripta Metallurgica et Materiala, Vol. 31, No. 11, pp. 1461-1464, 1994.

A reference to such a phase can also be found in an article by B. Gleeson et al. entitled "Effects on platinum on the interdiffusion and oxidation behavior of Ni—Al-based alloys", published in the Proceedings of the 6th International Symposium on High Temperature Corrosion and Protection of Materials, Materials Science Forum, Vols. 461-464, pp. 213-222, 2004.

Advantageously, the Ni—Pt—Al ternary system has a composition Ni$_z$Pt$_y$Al$_x$ in which $z$, $y$, and $x$ are such that $0.05 \leq z \leq 0.40$, $0.30 \leq y \leq 0.60$, and $0.15 \leq x \leq 0.40$.

The bonding underlayer may comprise one or more additional metals other than Al, Ni, and Pt, and in particular at least one metal elected from chromium and cobalt which contributes to stability, and/or at least one precious metal selected from palladium, ruthenium, and rhenium.

The bonding underlayer may also include at least one reactive element selected from the group constituted by yttrium, zirconium, hafnium, and the lanthanides.

In all cases, the majority of the bonding underlayer remains formed by the ternary Ni—Pt—Al system, which preferably represents at least 75% (atomic percentage) of the composition of the underlayer.

The thickness of the bonding underlayer advantageously lies in the range 2 µm to 120 µm, and is preferably less than 40 µm. It is possible to choose a small thickness, less than 40 µm, because of the stability conferred by the presence of the α-NiPt phase, thereby limiting the fabrication cost and the mass of the bonding underlayer.

Another object of the invention is to provide a method of forming a thermal protective coating constituting a thermal barrier on a superalloy metal substrate with a bonding underlayer which is stable and can have a reduced mass.

This object is achieved by a method comprising forming a bonding underlayer on the substrate, said underlayer comprising an intermetallic compound of aluminum, nickel, and platinum, and forming a ceramic outer layer which is anchored on an alumina film present on the bonding underlayer, in which method, in accordance with the invention, a bonding under-layer is formed that essentially comprises an Ni—Pt—Al ternary system constituted by a structure of the aluminum-enriched α-NiPt type.

In an implementation of the method, the bonding underlayer is made by forming on the substrate a coating of composition corresponding to the composition desired for the underlayer. In which case, a coating formation process is used that is of the overlay type, i.e. that does not involve in substantial or significant manner any diffusion of elements coming from the substrate into the coating.

Amongst the processes that are suitable, mention can be made of physical vapor deposition, deposition by cathode sputtering, or by plasma projection, and electro-deposition.

The bonding underlayer may thus be formed by physical vapor deposition of at least a plurality of individual layers respectively of platinum, nickel, and aluminum, and by causing the metals of the deposited layers to react together.

It is also possible to deposit at least some layers including a plurality of components of the bonding underlayer in pre-alloyed form, for example it is possible to deposit pre-alloyed layers such as NiPt or PtAl in alternation with layers of Al or Ni.

It is also possible to envisage forming the bonding underlayer by physical vapor deposition from a source having a composition corresponding to that which is desired for the bonding underlayer, for example by plasma projection from a pre-alloyed powder mixture.

In another implementation of the invention, the bonding underlayer is formed on a nickel-based superalloy substrate by physical vapor deposition of at least a plurality of alternating individual layers of platinum and of aluminum, by causing the metals of the layers deposited at a moderate temperature, i.e. lower than 900° C., and typically about 700° C., to react exothermally, and by heat treatment so as to cause nickel from the substrate to diffuse into the bonding underlayer. The heat treatment can be performed separately from forming the ceramic outer layer or it can be the result of forming the ceramic outer layer when it is made at relatively high temperature. It has been found by the Applicant that heat treatment at a temperature of not less than 900° C. suffices to cause nickel to diffuse from the substrate throughout the bonding underlayer providing the underlayer is of relatively small thickness, e.g. less than or equal to 10 µm, with a higher temperature possibly being required if the thickness is greater. It has also been found that such diffusion leads to a stable phase of the α-NiPt type being formed.

BRIEF DESCRIPTION OF THE DRAWINGS

The invention will be better understood on reading the following description given by way of non-limiting indication.

Reference is made to the accompanying drawings, in which.

DETAILED DESCRIPTION OF THE INVENTION

The description below relates to making a protective coating on a superalloy metal part, typically a gas turbine part, such as a turbine blade for a turbojet.

Figure 1:
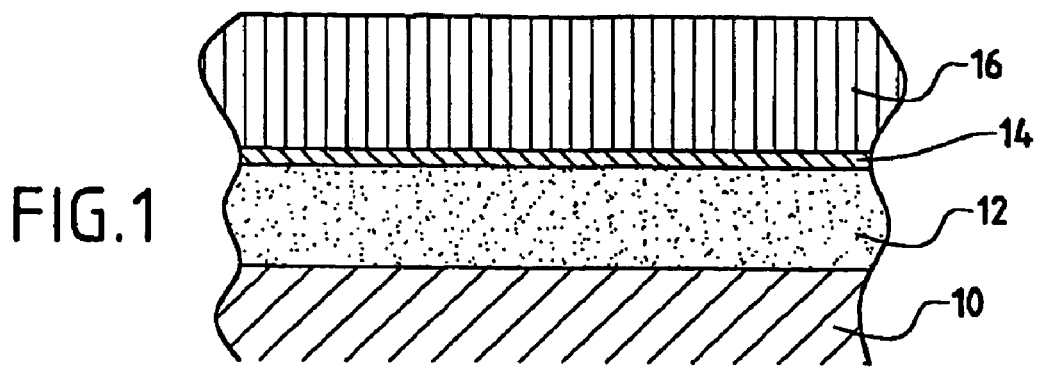
FIG. 1 is a highly diagrammatic section view of a superalloy metal substrate provided with a protective coating.

The protective coating is of the type shown highly diagrammatically in FIG. 1. On a metal substrate 10 made of superalloy, there is formed a coating comprising a bonding underlayer 12 made of an intermetallic compound formed mainly of aluminum, nickel, and platinum, and a ceramic outer layer 16 anchored on an alumina film 14 developed on the surface of the bonding underlayer.

Figure 2:
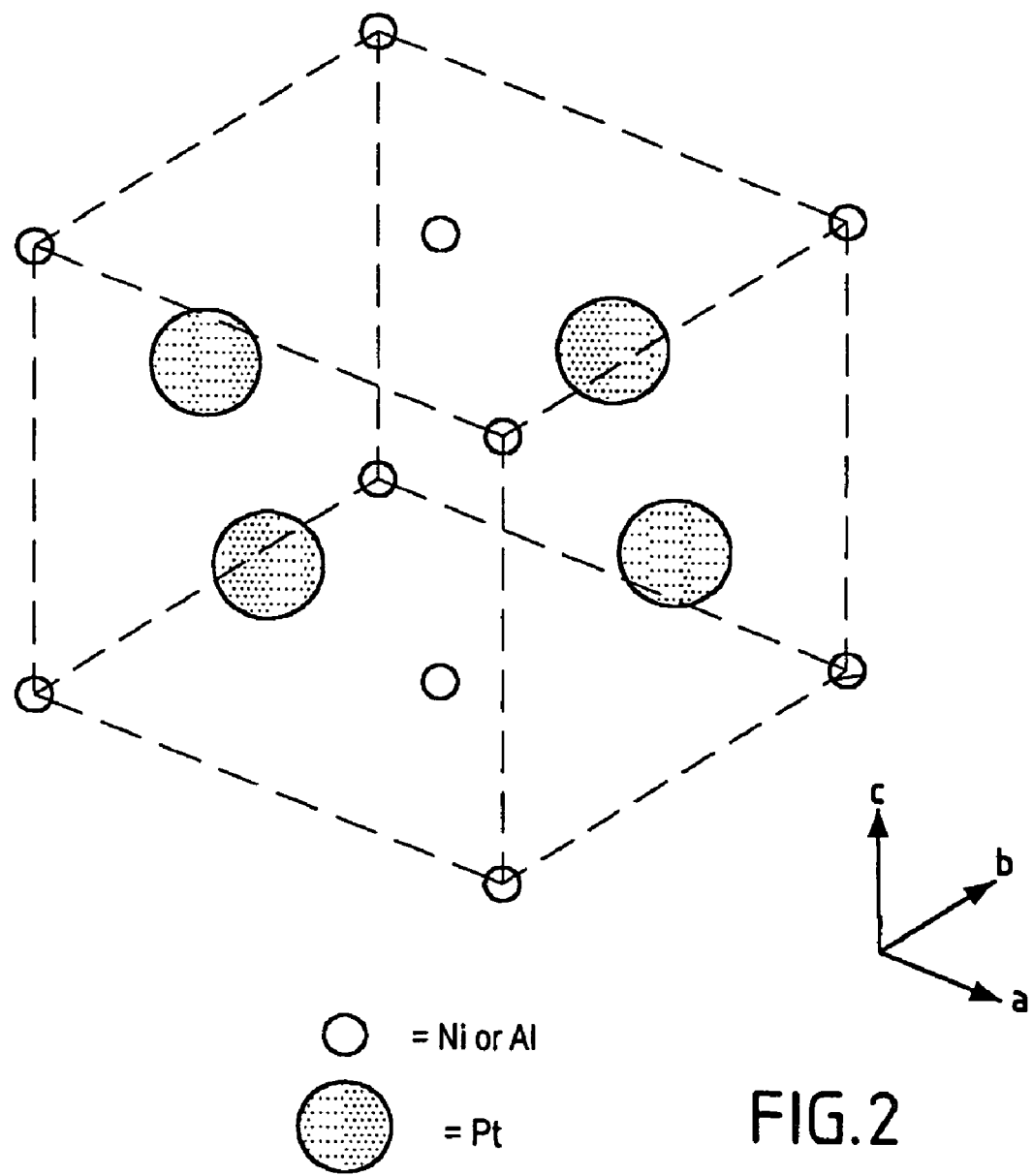
FIG. 2 is a diagram of a lattice cell characteristic of an aluminum-enriched α-NiPt solid solution phase.

In accordance with the invention, the majority of the intermetallic compound forming the bonding underlayer comprises an aluminum-enriched Ni—Pt—Al ternary system constituted by a phase of the α-NiPt type. Such a phase may be defined by its lattice structure, as shown in FIG. 2. This structure is a face-centered tetragonal system of type $L1_o$. Atoms of Ni and Al are disposed at the vertices and at the centers of the (001) faces, while atoms of Pt are situated at the centers of the (100) and (010) faces. For one lattice cell, the dimensions $\underline{a}$, $\underline{b}$, and $\underline{c}$ (FIG. 2) are such that 0.37 nm ≦ a=b ≦ 0.40 nm, and 0.35 nm ≦ c ≦ 0.36 nm. It is preferable to select an $Ni_xPt_yAl_x$ ternary system in which $\underline{z}$, $\underline{y}$, and $\underline{x}$ are such that 0.05 ≦ z ≦ 0.40, 0.30 ≦ y ≦ 0.60, and 0.15 ≦ x ≦ 0.40.

The domain containing the α-NiPt phase is totally separate from the domain containing the β-NiAl phase, as is confirmed by the above-cited article by B. Gleeson et al.

Elements other than Ni, Al, and Pt can be added to the composition of the bonding underlayer, in particular reactive elements selected from yttrium, zirconium, hafnium, and the lanthanides which serve to reinforce the diffusion barrier function against certain elements of the substrate that could be harmful to the strength of the protective coating, and which enhance the persistence of the alumina film. Other metals having a beneficial effect may also be added, e.g. palladium, ruthenium, or rhenium, or even cobalt and/or chromium which improve the thermal stability of the coating.

The alumina film 14 is produced by oxidation of the aluminum of the diffusion barrier. It provides a protective function against corrosion by oxidation. It also provides for attachment of the ceramic outer layer 16 by virtue of its "adhesive" nature.

The ceramic outer coating 16 essentially provides a thermal insulation function. It is made of refractory oxide, such as zirconia, yttrium oxide, or yttria stabilised zirconia. It may be formed by physical vapor deposition, e.g. by electron beam evaporation or by plasma-assisted evaporation, as is well known in the art.

The composition of the bonding underlayer may be as follows (in atomic percentages):

in the range 75% to 100% of the above-defined Ni—Pt—Al ternary system;

in the range 0% to 10% cobalt and/or chromium;

in the range 0% to 5% reactive element(s) selected from Y, Zr, Hf, and the lanthanides; and in the range 0% to 10% precious metals selected from Pd, Ru, and Rh.

The thickness of the bonding underlayer preferably lies in the range 2 μm to 120 μm. Because of the great thermal stability conferred by the α-NiPt phase, this thickness may advantageously be less than 40 μm, or even less than 20 μm.

First Implementation

Figure 3:
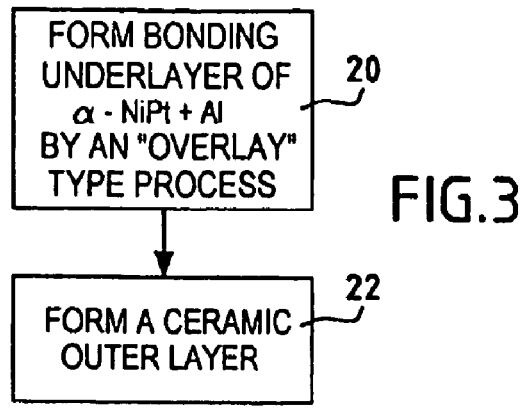
FIG. 3 shows an implementation of a method of the invention.

In a first implementation (FIG. 3), the bonding underlayer is formed by making a coating having the composition desired for the bonding underlayer, without causing substantial or significant diffusion of elements coming from the substrate, i.e. by implementing an overlay type process (step 20).

Thereafter, (step 22), an outer layer is formed on the bonding under-layer with growth of the alumina film that develops at the surface thereof. For this purpose, it is possible to use a physical vapor deposition method under an electron beam (EB-PVD). The metallic substrates carrying the bonding underlayer are placed in an enclosure above a source of ceramic, e.g. a yttria stabilised zirconia target. Deposition is performed under a reduced atmosphere comprising a mixture of argon and oxygen by exciting an electron gun facing the source of ceramic. That method is well known in the art.

Step 20 can be performed in several ways, in particular by implementing a physical vapor deposition process such as cathode sputtering, electron beam PVD, or evaporation under an arc, with or without assistance from a plasma.

In a first variant (FIG. 4), step 20 comprises M repeats of a sequence of depositions of single layers of platinum (step 201), aluminum (step 202), platinum (step 203), and nickel (step 204), followed by a final deposition of a single layer of platinum (step 205). Moderate heat treatment (step 206) can then be performed prior to forming the outer layer of ceramic, so as to form an intermetallic compound by causing reaction to take place between the metals of the single layers. Heat treatment is performed at a temperature lower than 900° C., e.g. about 700° C., so that no diffusion of elements from the substrate into the adjacent portion of the intermetallic compound is encouraged. The heat treatment is performed in a vacuum or in an inert atmosphere for a duration lying in the range 0.5 hours (h) to 3 h, for example.

It should be observed that the moderate heat treatment is optional, and the intermetallic compound can also be formed under the effect of the temperature rise that occurs while making the ceramic outer layer.

It should also be observed that in the sequence of depositing single layers, a single layer of aluminum is preferably placed between two single layers of platinum in order to avoid any reaction between aluminum and nickel which could disturb the diffusion of platinum in the intermetallic compound. The first single layer is a layer constituted essentially by platinum since that is less likely to diffuse into the substrate. The last single layer is also preferably a layer of platinum since that is less likely to oxidize in air or in a partial pressure of oxygen at the end of making the bonding underlayer.

The single layers are made to have individual thicknesses, at least for aluminum, of less than 2000 nanometers (nm), and preferably of no more than 1500 nm. Layer thickness may be selected to be well below this threshold, for example no more than 200 nm. Such a relatively small thickness is selected if, after heat treatment, it is desired to obtain a structure that is homogenous, i.e. that does not leave any trace of the bonding underlayer being built up from superposed layers.

The number M of sequences is determined as a function of the thicknesses of the single layers and of the total thickness desired for the bonding underlayer. Depending on the value of said total thickness, the number of single layers may vary over the range a plurality of units to a plurality of tens, or even a plurality of hundreds.

It should be observed that the single layers, as deposited, may be of different thicknesses.

In all cases, the ratios between the total thickness of the layers for each metal are a function of the composition desired for the intermetallic compound forming the bonding underlayer.

Figure 4:
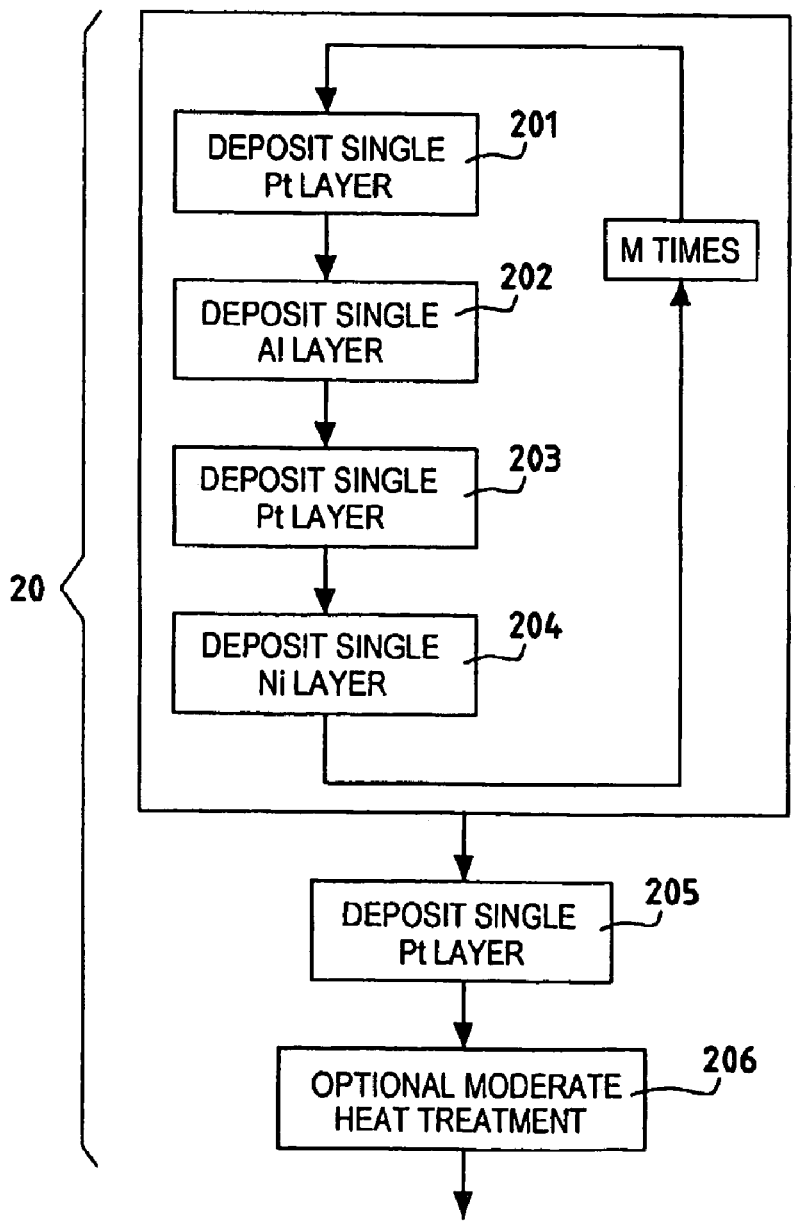
FIGS. 4 to 6 show examples of implementations of a first step in the method of FIG. 3.

In a second variant (FIG. 5), step 20 comprises N repeats of a sequence of single layer depositions of a binary system, e.g. an NiPt (step 210), and of aluminum (step 211), prior to optional moderate heat treatment (step 206) as in the process of FIG. 4. Naturally, in a variant, it is possible to alternate depositing a PtAl binary system and nickel Ni. The composition of the NiPt binary system, the thicknesses of the single layers and the numbers thereof, are selected as a function of the composition and the thickness desired for the bonding underlayer.

In a third variant (FIG. 6), step 20 comprises successively depositing P layers of an Ni—Pt—Al ternary system (step 215) prior to optional moderate heat treatment (step 206).

Each layer is given a composition corresponding to the composition desired for the bonding underlayer.

Figure 5:
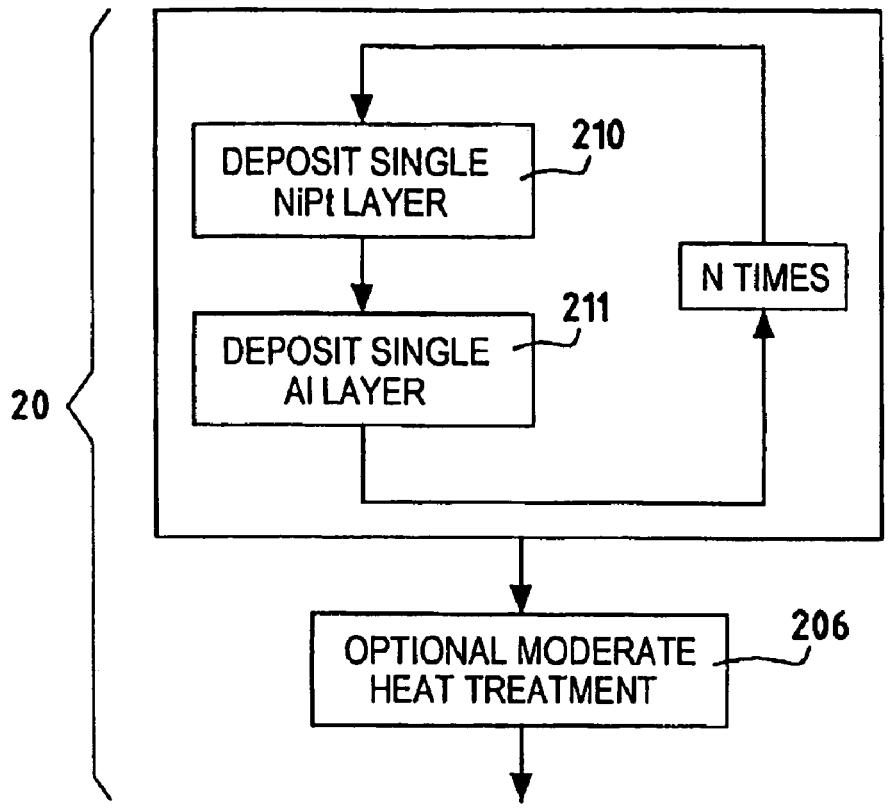
Figure 6:
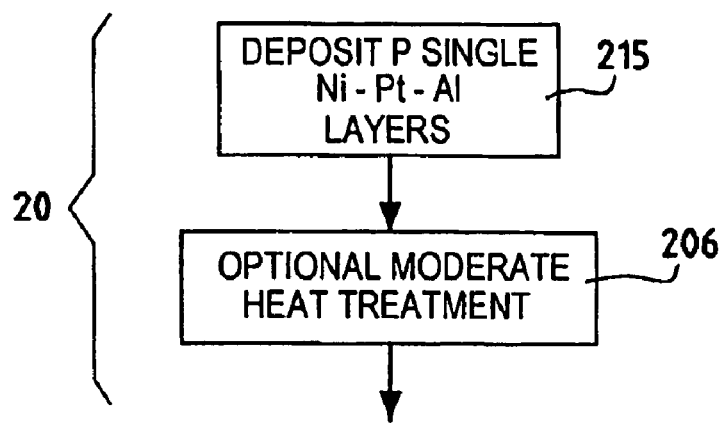

In the processes of FIGS. 4 to 6 as described above, in particular when using a PVD process, sources or targets are used that are made of nickel, of platinum, or of aluminum, or that are made of an alloy of two of those materials, or that are made of an alloy of all three metals, the metals being present, for example, in the form of powders. When additional metals or other elements are also to be incorporated in the bonding underlayer, they may be provided by additional sources or targets so as to be deposited in distinct single layers, or they may previously be alloyed in the desired proportions in one or more of the nickel and/or platinum and/or aluminum sources or targets.

In yet another variant, the bonding underlayer may be formed by electro-deposition without significant interaction with the substrate. It is possible to proceed by depositing successive layers of different metals or by co-deposition of these metals.

Second Implementation

Figure 7:
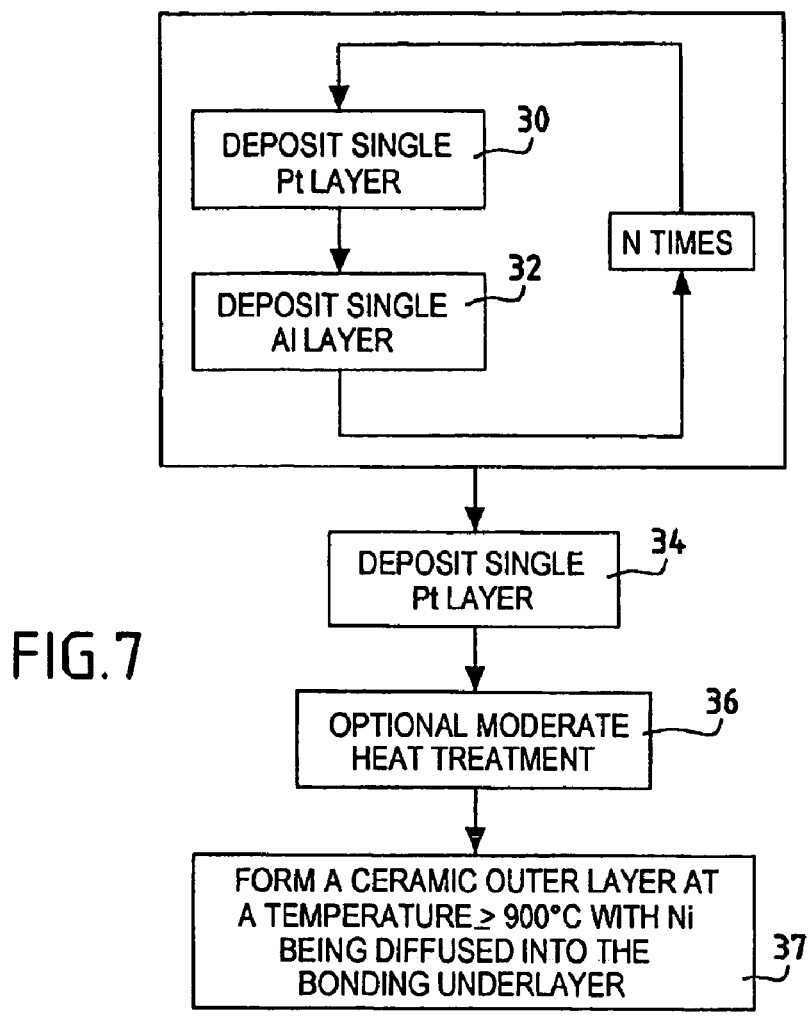
FIG. 7 shows another implementation of the method of the invention.

In a second implementation (FIG. 7), with a metal substrate made of a nickel-based superalloy, the bonding underlayer is made by forming, in a first portion of the process, an intermetallic compound essentially comprising aluminum and platinum, and in a subsequent portion of the process, by causing nickel from the substrate to diffuse by raising the temperature before or during formation of the ceramic outer layer.

The first portion of the process can be performed by alternating deposits of single layers of platinum (step 30) and of aluminum (step 32) using a physical vapor deposition process, and by causing an exothermal reaction to take place between the layers formed thereby. To this end, it is possible to use the method described in above-cited US patent application No. US 2002/0037220.

For the reasons already given, the first single layer to be deposited on the substrate and the last single layer to be deposited (step 34) are preferably platinum layers.

A moderate heat treatment step 36 is performed so as to form an intermetallic compound by exothermal reaction between the platinum and the aluminum of the single layers that have been formed. The heat treatment is performed at a temperature lower than 900° C., e.g. about 700° C., so that no diffusion of elements from the metal substrate into the adjacent portion of the intermetallic compound is encouraged. The heat treatment is performed under a non-oxidizing atmosphere, e.g. under a vacuum or an inert atmosphere for a duration lying in the range 0.5 h to 3 h, e.g. about 2 h. During heat treatment, the aluminum in any one layer diffuses into the adjacent layers of platinum. A thin film of alumina develops on the surface of the bonding underlayer as obtained in this way during subsequent exposure to an oxidizing medium.

The single layers are made to have individual thicknesses, at least for aluminum of less than 2000 nm, and preferably no greater than 1500 mm. It is possible for this thickness to be selected well below this threshold, e.g. no greater than 200 nm.

The thicknesses and the number of layers are selected so as to obtain an Al/Pt ratio corresponding to that which is desired in the bonding underlayer and so as to obtain the thickness that is desired therefor.

The single layers of platinum and of aluminum may be deposited by cathode sputtering, by electron beam physical vapor deposition, or by evaporation under an arc, with or without a plasma, which processes make it possible to control quite accurately the quantity of metal that is deposited, and thus the thicknesses of the single layers. Such processes are well known in themselves and they use sources or targets made of platinum and of aluminum.

At least one additional metal and/or at least one reactive element can be deposited within the bonding underlayer by using one or more additional sources or targets, or by incorporating those materials in the sources or targets of platinum and aluminum.

Thereafter, the ceramic outer layer is made (step 37), but after raising the temperature of the substrate to a value that is high enough to cause the nickel contained in the metal substrate to diffuse within the bonding underlayer. This temperature should be selected to be increasingly high for increasing thickness of the bonding underlayer. It is preferably equal to not less than 900° C. for a thickness lying in the range 2 μm to 10 μm, and it may exceed 1000° C. for a greater thickness.

Other metals from the substrate are also likely to diffuse, such as cobalt and chromium. Nevertheless, the bonding underlayer conserves its diffusion barrier function against elements that might be contained in the substrate, such as tungsten, molybdenum, tantalum, which could have a harmful effect on the strength of the protective coating, in particular on the persistence of the alumina film at the surface of the bonding underlayer.

The Applicant has been able to show that nickel diffusing in the bonding underlayer co-operates with the platinum to form a stable phase of the α-NiPt type.

In a variant, the heat treatment at a temperature of at least 900° C., seeking to cause nickel from the substrate to diffuse into the bonding underlayer, can be performed separately, prior to forming the ceramic outer layer.

EXAMPLE 1

Metal parts were used made of a single crystal superalloy based on nickel and having the following composition (percentages by weight): 6.5% Co, 7.5% Cr, 5.3% Al, 1.2% Ti, 8% Ta, 2% Mo, 5.5% W, with the balance being Ni.

Parts were provided with alternating layers of platinum and aluminum by a physical vapor deposition process using cathode sputtering, in application of the second implementation described above (FIG. 7). 84 single layers of platinum were deposited each having a thickness of 30 nm, alternating with 83 single layers of aluminum each having a thickness of 66 nm.

Temperature was raised to 700° C. for 2 h in order to trigger an exothermal reaction between the single layers, causing a PtAl$_2$ type platinum and aluminum intermetallic compound to be formed in a layer having a thickness of 7.5 μm.

Thereafter, a ceramic outer layer of zirconia ZrO$_2$ stabilized with yttrium oxide Y$_2$O$_3$ (representing 8% by weight) was deposited. Deposition took place as described above by electron beam physical vapor deposition. The temperature of the substrate was raised to about 1000° C. and the duration was selected so as to form an outer layer of yttria stabilised zirconia having a thickness equal to about 125 μm.

EXAMPLE 2

The procedure was the same as in Example 1, but the number of single layers of platinum and aluminum was limited so as to obtain, after exothermal reaction between them, a PtAl$_2$ type intermetallic compound in a layer having a thickness equal to about 2.5 μm.

Figure 8:
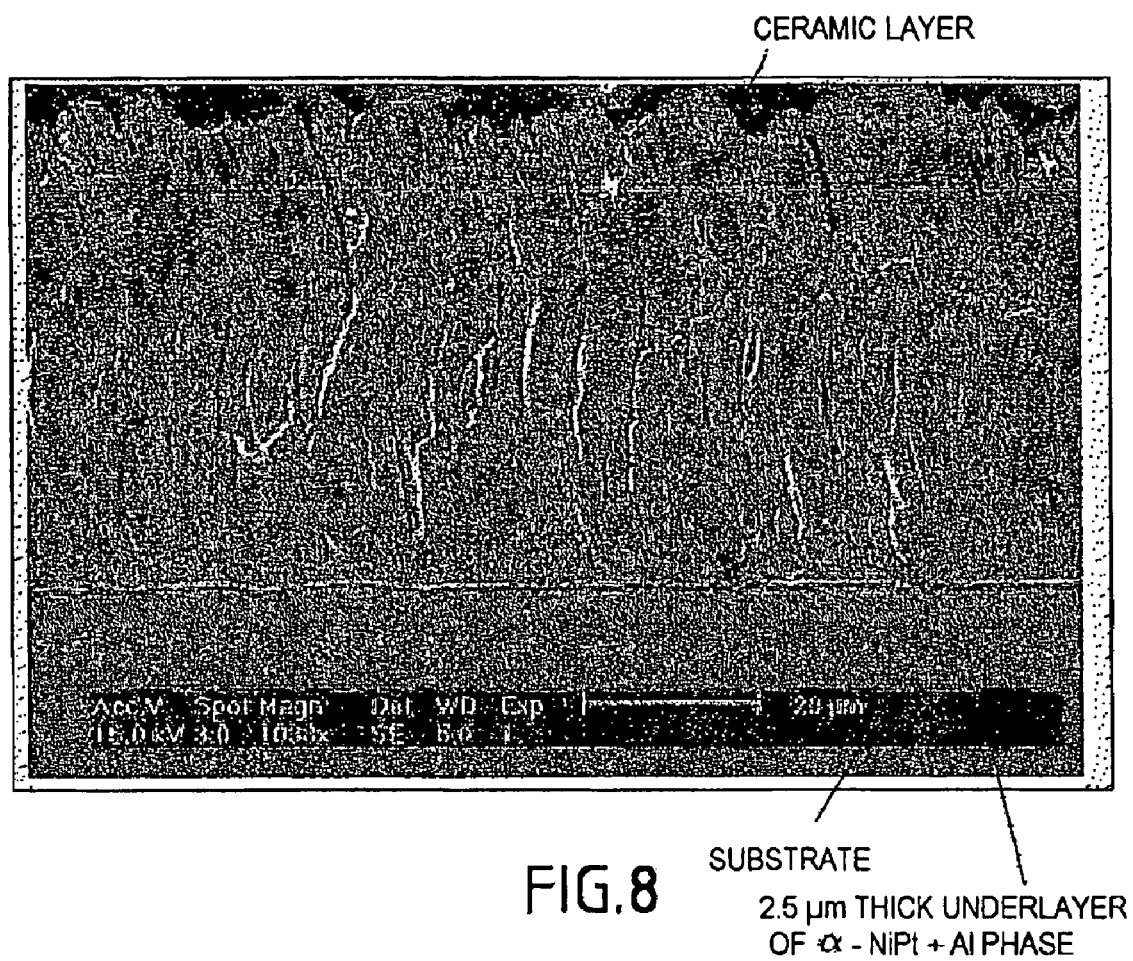
FIG. 8 is a photograph taken with scanning electron microscope and showing a cross-section of a protective coating made in accordance with an implementation of the invention on a superalloy metal substrate.

The microphotograph of FIG. 8 shows the results that were obtained.

EXAMPLE 3 (FOR COMPARISON)

On substrates having the same composition as that of Examples 1 and 2, a bonding underlayer was formed by electro-deposition of a platinum layer and by vapor aluminization so as to obtain, in a manner that is known in the prior art, a bonding underlayer corresponding to a platinum-enriched β-type phase of the Ni—Al binary phase diagram. The thickness of the bonding underlayer was 60 μm. Thereafter, a ceramic outer layer was formed as described in Example 1.

Tests for ability to withstand thermal cycling in an oxidizing medium (air) were performed on the parts A, B, and C as obtained in Examples 1, 2, and 3 respectively, each cycle comprising a rapid temperature rise up to 1100° C. which was maintained for 1 h, after which there was a return to ambient temperature which was maintained for 15 minutes (min).

Figure 9:
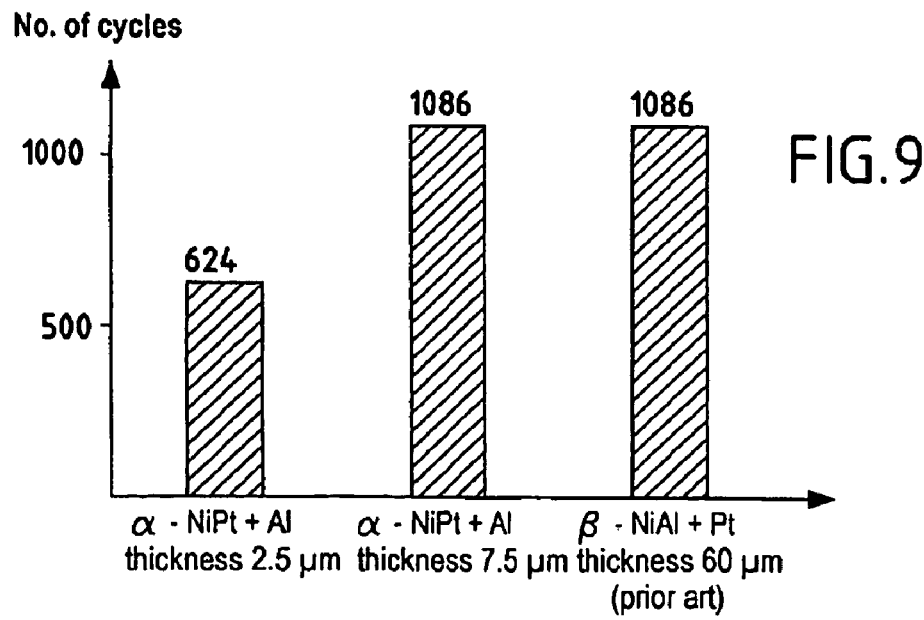
FIG. 9 shows the results of tests performed on parts made with coatings of the invention and in accordance with the prior art.

As shown in FIG. 9, the parts B withstood 624 cycles in satisfactory manner, which is a very remarkable result given the very small thickness (2.5 μm) of the bonding underlayer, when compared with the thicknesses of the bonding underlayers presently in use (commonest 60 μm). Parts A and C withstood cycling in satisfactory manner up to 1086 cycles.

The possibility of using a thin bonding underlayer leads to faster implementation, to a saving in materials cost (even though the platinum content is relatively high), and to a saving in terms of weight, all of which constitute significant advantages.

EXAMPLE 4

A single crystal superalloy metal part as defined in Example 1 was provided with layers by repeating the sequence Pt, Al, Pt, Ni with a final layer of Pt (variant of the above-described first implementation as shown in FIG. 4). A physical vapor deposition process by cathode sputtering was used. Thirteen single layers of Pt were deposited each having a thickness of 181 nm, six individual layers of Ni were deposited each having a thickness of about 268 nm, and six individual layers of Al were deposited each having a thickness of about 171 nm.

Moderate heat treatment at a temperature of about 700° C. under a vacuum was performed in order to trigger a reaction between the single layers without leading to migration from the substrate of single crystal superalloy. A coating was thus obtained made of an intermetallic compound having a thickness approximately equal to 7.1 μm. The composition in atomic percentages of the coating was 45% Pt, 28% Al, and 27% Ni. The coating was examined by X-ray diffraction which demonstrated the existence of a crystallographic structure characteristic of an aluminum-enriched α-NiPt phase.

Figure 10:
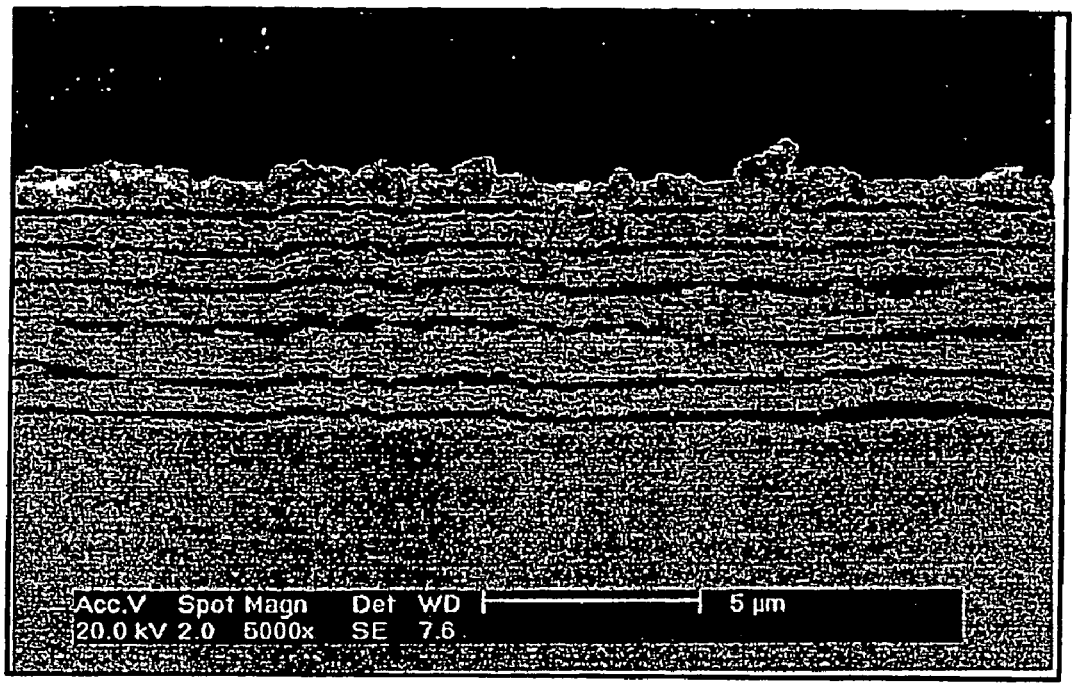
FIGS. 10 and 11 are photographs taken with a scanning electron microscope showing a cross-section of the protective coating made using another implementation of the invention, both before and after moderate heat treatment.
Figure 11:
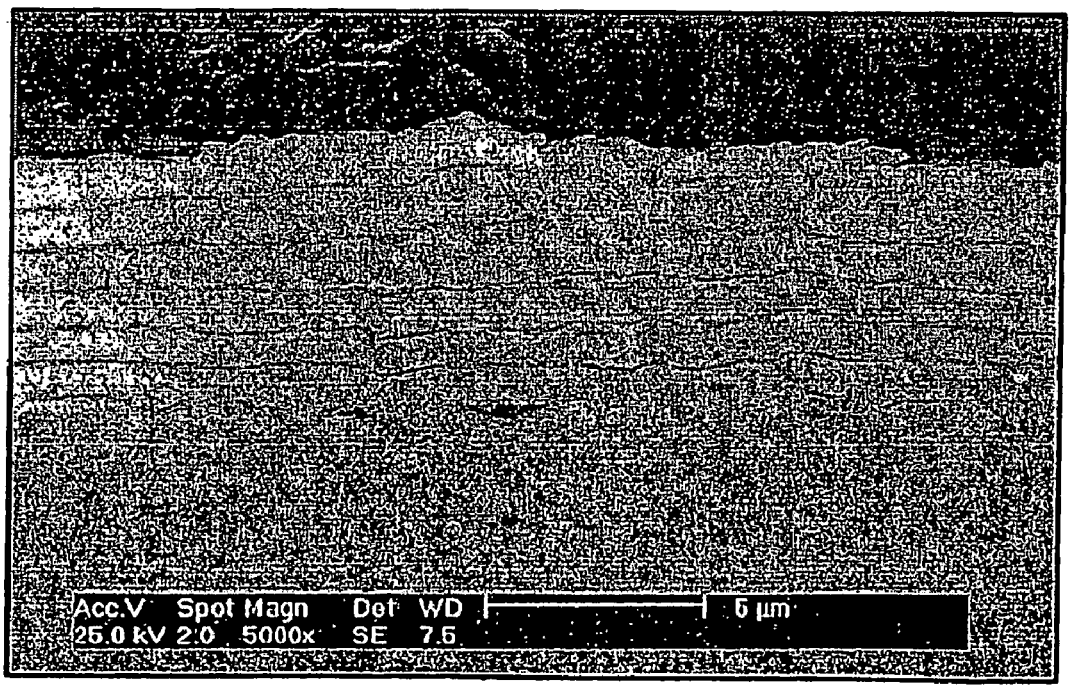

FIGS. 10 and 11 show the coating, in section, respectively before and after moderate heat treatment.

What is claimed is:

1. A method of forming a thermal protective coating on a superalloy metal substrate, the method comprising:
   forming a bonding underlayer on the substrate, said underlayer comprising an intermetallic compound of aluminum, nickel, and platinum; and
   forming a ceramic outer layer which is anchored on an alumina film present on the bonding underlayer, wherein a bonding underlayer is formed comprising in majority by atomic percentage an Ni—Pt—Al ternary system constituted by aluminum-enriched α-NiPt structure.

2. A method according to claim 1, wherein the bonding underlayer is made by forming on the substrate a coating of composition corresponding to the composition desired for the underlayer.

3. A method according to claim 2, wherein the bonding underlayer is made by forming a coating by physical vapor deposition.

4. A method according to claim 3, wherein the bonding underlayer is formed by physical vapor deposition of a plurality of single layers respectively of platinum, nickel, and aluminum, and by causing the metals of the deposited layers to react together.

5. A method according to claim 3, wherein the bonding underlayer is formed by depositing layers, at least some of which comprise a plurality of components of the underlayer in pre-alloyed form.

6. A method according to claim 3, wherein the bonding underlayer is formed by depositing a pre-alloyed composition corresponding to the composition desired for the underlayer.

7. A method according to claim 2, wherein the bonding underlayer is made by forming a coating by electro deposition.

8. A method according to claim 1, wherein the bonding underlayer is formed on a superalloy substrate based on nickel, by physical vapor deposition of at least a plurality of alternating single layers of platinum and of aluminum, by exothermal reaction between the metals of the deposited layers, and by heat treatment at a temperature of not less than 900° C. in order to cause nickel from the substrate to diffuse into the bonding underlayer.

9. A method according to claim 8, wherein the heat treatment at a temperature of not less than 900° C. is performed while forming the ceramic outer layer.

10. A method according to claim 8, wherein the heat treatment at a temperature of not less than 900° C. is performed prior to forming the ceramic outer layer.

11. A method according to claim 1, wherein the Ni—Pt—Al ternary system has a composition Ni$_z$Pt$_y$Al$_x$ in which z, y, and x are such that $0.05 \leq z \leq 0.40$, $0.30 \leq y \leq 0.60$, and $0.15 \leq x \leq 0.40$.

* * * * *